(12) United States Patent
Cao

(10) Patent No.: US 11,404,664 B2
(45) Date of Patent: Aug. 2, 2022

(54) ORGANIC LIGHT EMITTING DIODE DEVICE AND METHOD OF MANUFACTURING THEREOF

(71) Applicant: WUHAN CHINA STAR OPTOELECTRONICS SEMICONDUCTOR DISPLAY TECHNOLOGY CO., LTD., Wuhan (CN)

(72) Inventor: Jun Cao, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 587 days.

(21) Appl. No.: 16/326,758

(22) PCT Filed: Jan. 18, 2019

(86) PCT No.: PCT/CN2019/072272
§ 371 (c)(1),
(2) Date: Feb. 20, 2019

(87) PCT Pub. No.: WO2020/113791
PCT Pub. Date: Jun. 11, 2020

(65) Prior Publication Data
US 2021/0336199 A1    Oct. 28, 2021

(30) Foreign Application Priority Data

Dec. 7, 2018 (CN) .......................... 201811493100.7

(51) Int. Cl.
*H01L 51/52* (2006.01)
*H01L 51/56* (2006.01)

(52) U.S. Cl.
CPC ........ *H01L 51/5253* (2013.01); *H01L 51/524* (2013.01); *H01L 51/56* (2013.01)

(58) Field of Classification Search
CPC .............. H01L 51/529; H01L 51/5259; H01L 51/5253; H01L 27/3244; H01L 27/322;
(Continued)

(56) References Cited

U.S. PATENT DOCUMENTS

2007/0080377 A1* 4/2007 Sung ................... H01L 27/3276
257/253
2018/0061722 A1    3/2018 Byun et al.
(Continued)

FOREIGN PATENT DOCUMENTS

| CN | 105895827 A | 8/2016 |
| CN | 107808930 A | 3/2018 |
| JP | 2014149994 A | 8/2014 |

*Primary Examiner* — Caridad Everhart
(74) *Attorney, Agent, or Firm* — JMB Davis Ben-David

(57) ABSTRACT

An organic light emitting diode (OLED) device and the method of manufacturing thereof. The OLED device comprising a substrate, a display region, a non-display region, and an encapsulation structure; wherein the encapsulation structure comprises: at least one ring of barrier wall on the non-display region; an encapsulating film laminate covering the display region and the non-display region, the encapsulating film laminate comprising an organic film; an organic thin film detecting device surrounding the barrier wall, after detecting that the organic film overflows the barrier wall, the organic thin film detecting device emits an electrical signal indicating overflow.

10 Claims, 2 Drawing Sheets

(58) Field of Classification Search
CPC ....... H01L 2251/301; H01L 2251/5369; H01L 51/5246
See application file for complete search history.

(56) References Cited

U.S. PATENT DOCUMENTS

2018/0102502 A1* 4/2018 Kim .................... H01L 27/3276
2018/0226607 A1    8/2018 Li et al.
2018/0366529 A1* 12/2018 Lee .................... H01L 27/3262
2019/0103579 A1* 4/2019 Kim .................... H01L 51/5243

* cited by examiner

ORGANIC LIGHT EMITTING DIODE DEVICE AND METHOD OF MANUFACTURING THEREOF

CROSS REFERENCE TO RELATED APPLICATION

This is a U.S. National Stage of International Application No. PCT/CN2019/072272, filed on 2019 Jan. 18, which claims priority to Chinese Application No. 201811493100.7, filed on 2018 Dec. 7. The entire disclosures of each of the above applications are incorporated herein by reference.

BACKGROUND OF INVENTION

Field of Invention

The present invention relates to the field of display technologies, and in particular, to an organic light emitting diode (OLED) device and a method of manufacturing thereof.

Description of Prior Art

Screens of organic light emitting diode (OLED) displays that are widely used in the display field generally employ a top-emitting device structure. The OLED devices consist of an anode, an organic layer, and a cathode. The organic layer includes an electric hole injection layer, an electric hole transport layer, an organic light emitting layer, an electron transport layer, and an electron injection layer.

Because the organic light-emitting layer and the cathode are very sensitive to water and oxygen, it is particularly important to prevent water and oxygen from invading the organic light-emitting layer in the OLED. Currently, thin film encapsulation (TFE) is used to protect OLED devices. For TFE technology, the most important things are its water-blocking performance and oxygen-blocking performance, and on this basis, the optical penetration and flexible bending properties of the TFE film layer should be taken into account as well. For OLED devices, the intrusion ways of external water and oxygen can be classified into two categories: by one way water and oxygen directly penetrate the TFT film layer from top to bottom and get into the OLED device, and by the other way water and oxygen penetrate the TFT film layer from the side of the TFE film and erode the OLED device. For current TFE structures, they usually prevent water and oxygen from eroding the OLED device through the first way, which resulting in water and oxygen to get into the OLED display panel through the second way and erode the OLED device. One conventional method for blocking the erosion of water and oxygen is to provide a sandwich structure of an inorganic barrier layer/an organic buffer layer/an inorganic barrier layer on the periphery of the OLED device. The organic buffer layer in the three layers is the weakest in blocking the erosion of water and oxygen, and water and oxygen can pass through it relatively easily. Therefore, in the design of the encapsulation structure, it is necessary to completely wrap the organic buffer layer between the first inorganic barrier layer and the second inorganic barrier layer. However, the boundary control for controlling the organic buffer layer is currently not perfect enough, and it is difficulty to make the organic buffer layer be wrapped completely between the first inorganic barrier layer and the second inorganic barrier layer without overflow.

Therefore, there is a need for an organic layer overflow indicating device that can emit an indication signal to prompt users when the organic layer overflows.

SUMMARY OF INVENTION

The present invention provides an organic light emitting diode (OLED) device and method of manufacturing thereof, which that can emit an indication signal to prompt users when the organic layer overflows.

Specifically, the present invention provides an OLED device comprising a substrate, a display region at a center of the substrate, a non-display region surrounding the display region, and an encapsulation structure; wherein the encapsulation structure includes: at least one ring of barrier wall on the non-display region, the barrier wall surrounding the display region, a fixed interval being disposed between an edge of the barrier wall close to the display region and an edge of the display region; an encapsulating film laminate covering the display region and the non-display region, the encapsulating film laminate comprising an organic film, an edge of the organic film being defined between the barrier wall and the display region; an organic thin film detecting device surrounding the barrier wall, after detecting that the organic film overflows the barrier wall, the organic thin film detecting device emits an electrical signal indicating overflow; wherein the encapsulating film laminate includes at least a first inorganic film covering the barrier wall and the display region, a first organic film disposed above the first inorganic film, and a second inorganic film disposed above the first organic film; wherein the first inorganic film and the second inorganic film cover the display region and the non-display region, edges of the first inorganic film and the second inorganic film are located in the non-display region outside the barrier wall; the first organic film covers the display region, and an edge thereof is located between the barrier wall and the display region.

According to one aspect of the invention, the organic film includes conductive particles.

According to one aspect of the invention, the organic thin film detecting device includes a conductive loop disposed around the barrier wall, the conductive loop includes a first wire and a second wire surrounding the barrier wall, the first wire and the second wire are spaced disposed from one another and are respectively connected to a cathode and an anode of a power source; wherein a distance between the first wire and the second wire is less than or equals to the diameter of the conductive particles.

According to one aspect of the invention, the conductive particles are made of transparent materials having a diameter ranging from 2 to 10 µm; the first wire and the second wire have a width ranging from 1 to 10 µm and a thickness ranging from 0.1 to 1 µm.

According to one aspect of the invention, the organic thin film detecting device is disposed between the first inorganic thin film and the second inorganic thin film outside the barrier wall; the first organic film disposed between the first inorganic film and the second inorganic film.

Specifically, the present invention provides an organic light emitting diode (OLED) device comprising a substrate, a display region at a center of the substrate, a non-display region surrounding the display region, and a encapsulation structure; wherein the encapsulation structure includes: at least one ring of barrier wall on the non-display region, the barrier wall surrounding the display region, a fixed interval being disposed between an edge of the barrier wall close to the display region and an edge of the display region; an encapsulating film laminate covering the display region and the non-display region, the encapsulating film laminate comprising an organic film, an edge of the organic film being defined between the barrier wall and the display region; an organic thin film detecting device surrounding the barrier wall, after detecting that the organic film overflows the barrier wall, the organic thin film detecting device emits an electrical signal indicating overflow.

According to one aspect of the invention, the organic film includes conductive particles.

According to one aspect of the invention, the organic thin film detecting device includes a conductive loop disposed around the barrier wall, the conductive loop includes a first wire and a second wire surrounding the barrier wall, the first wire and the second wire are spaced disposed from one another and are respectively connected to a cathode and an anode of a power source; wherein a distance between the first wire and the second wire is less than or equals to the diameter of the conductive particles.

According to one aspect of the invention, the conductive particles are made of transparent materials having a diameter ranging from 2 to 10 μm; the first wire and the second wire have a width ranging from 1 to 10 μm and a thickness ranging from 0.1 to 1 μm.

According to one aspect of the invention, the encapsulating film laminate includes at least a first inorganic film covering the barrier wall and the display region, a first organic film disposed above the first inorganic film, and a second inorganic film disposed above the first organic film; wherein the first inorganic film and the second inorganic film cover the display region and the non-display region, edges of the first inorganic film and the second inorganic film are located in the non-display region outside the barrier wall; the first organic film covers the display region, and an edge thereof is located between the barrier wall and the display region.

According to one aspect of the invention, the organic thin film detecting device is disposed between the first inorganic thin film and the second inorganic thin film outside the barrier wall; the first organic film disposed between the first inorganic film and the second inorganic film.

Specifically, the present invention further provides a method of manufacturing an OLED device, comprising the steps of:

providing a substrate;

forming a display region and a non-display region surrounding the display region at a center of the substrate;

forming an encapsulation structure covering the display region and the non-display region; wherein the steps of forming the encapsulation structure includes:

forming at least one ring of barrier wall on the non-display region, the barrier wall surrounding the display region, a fixed interval being disposed between an edge of the barrier wall close to the display region and an edge of the display region;

forming a encapsulating film laminate covering the display region and the non-display region, the encapsulating film laminate comprising an organic film, the organic thin edge being defined between the barrier wall and the display region;

forming an organic thin film detecting device around the barrier wall, after detecting that the organic film overflows the barrier wall, the organic thin film detecting device emits an electrical signal indicating overflow.

According to one aspect of the invention, the organic film includes conductive particles, the conductive particles are made of transparent materials having a diameter ranging from 2 to 10 μm; the first and second wires have a width ranging from 1 to 10 μm and a thickness ranging from 0.1 to 1 μm.

According to one aspect of the invention, the organic thin film detecting device includes a conductive loop disposed around the barrier wall, the conductive loop includes a first wire and a second wire surrounding the barrier wall, the first wire and the second wire are spaced disposed from one another and are respectively connected to a cathode and an anode of a power source; wherein a distance between the first wire and the second wire is less than or equals to the diameter of the conductive particles.

According to one aspect of the invention, the encapsulating film laminate includes at least a first inorganic film covering the barrier wall and the display region, a first organic film disposed above the first inorganic film, and a second inorganic film disposed above the first organic film; wherein the first inorganic film and the second inorganic film cover the display region and the non-display region, edges of the first inorganic film and the second inorganic film are located in the non-display region outside the barrier wall; the first organic film covers the display region, and an edge thereof is located between the barrier wall and the display region;

the organic thin film detecting device is disposed between the first inorganic thin film and the second inorganic thin film outside the barrier wall; when the first organic film, which is also disposed between the first inorganic film and the second inorganic film, overflows the barrier wall, it can be brought into contact with the organic thin film detecting device, and make the organic thin film detecting device emit an electrical signal indicating overflow.

Beneficial Effect

In the technical solution of the present invention, conductive particles are added to the organic film of the encapsulation structure of the OLED device, and an organic thin film detecting device is disposed outside the barrier wall. When the organic film overflows the barrier wall, and be contact with the organic thin film detecting device, it will make the organic thin film detecting device emit an electrical signal indicating overflow to prompt users of the overflow condition.

DETAILED DESCRIPTION OF PREFERRED EMBODIMENTS

Figure 1:
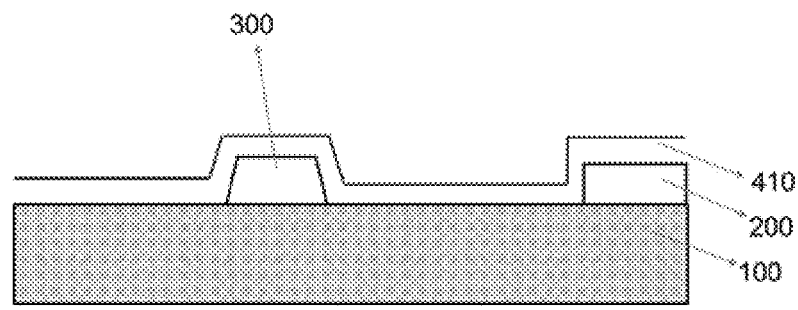
FIG. 1 to FIG. 4 are structural diagrams of an OLED device in each step of a method of manufacturing an OLED device according to an embodiment of the present invention.
Figure 2:
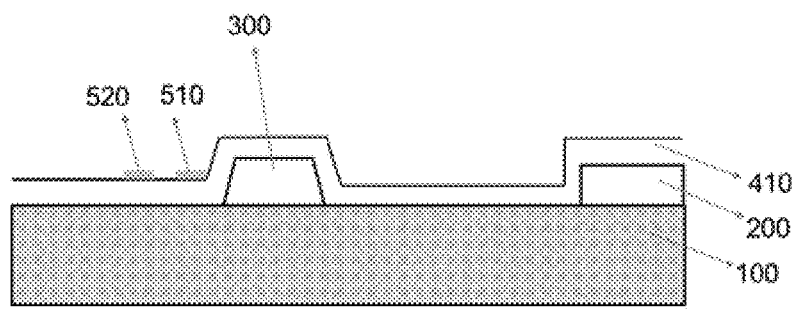
Figure 3:
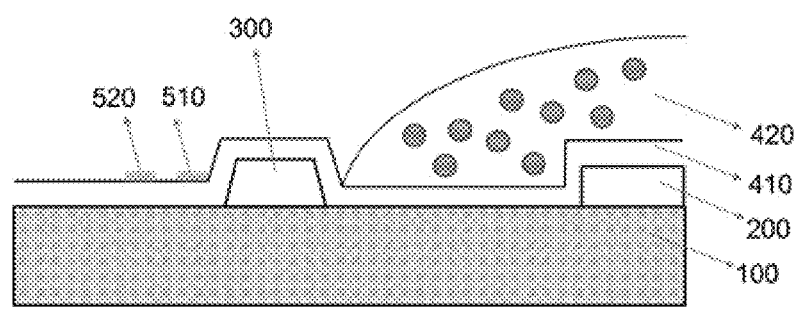

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

The invention will be described in detail below with reference to the drawings and specific embodiments. Specifically, the present invention provides an organic light emitting diode (OLED) device and method of manufacturing thereof, which that can emit an indication signal to prompt users when the organic layer overflows.

Figure 4:
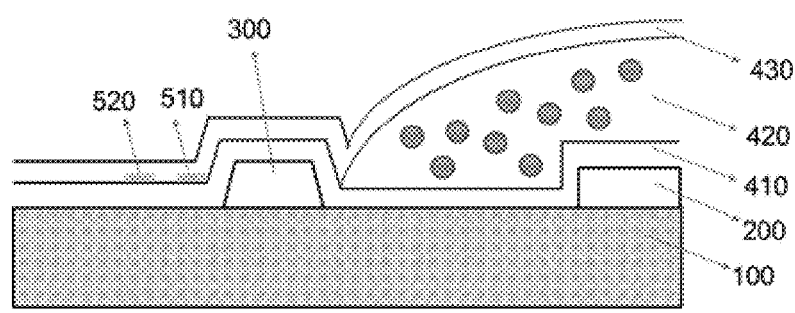

As shown in FIG. 4, the present invention provides an organic light emitting diode (OLED) device comprising a substrate 100, a display region 200 at a center of the substrate 100, a non-display region 200 surrounding the display region 200, and a encapsulation structure; wherein the encapsulation structure includes: at least one ring of barrier wall 300 on the non-display region 200, the barrier wall 300 surrounding the display region 200, a fixed interval being disposed between an edge of the barrier wall 300 close to the display region 200 and an edge of the display region 200; an encapsulating film laminate covering the display region 200 and the non-display region 200, the encapsulating film laminate comprising an organic film, an edge of the organic film being defined between the barrier wall 300 and the display region 200; an organic thin film detecting device surrounding the barrier wall 300, after detecting that the organic film overflows the barrier wall 300, the organic thin film detecting device emits an electrical signal indicating overflow.

In this embodiment, the encapsulating film laminate includes at least a first inorganic film 410 covering the barrier wall 300 and the display region 200, a first organic film 420 disposed above the first inorganic film 410, and a second inorganic film 430 disposed above the first organic film 420; wherein the first inorganic film 410 and the second inorganic film 430 cover the display region 200 and the non-display region 200, edges of the first inorganic film and the second inorganic film are located in the non-display region 200 outside the barrier wall 300; the first organic film 420 covers the display region 200, and an edge thereof is located between the barrier wall 300 and the display region 200.

Specifically, the organic film includes conductive particles, and the conductive particles are made of transparent materials having a diameter ranging from 2 to 10 μm; the first wire and the second wire have a width ranging from 1 to 10 μm and a thickness ranging from 0.1 to 1 μm.

The organic thin film detecting device is disposed between the first inorganic thin film and the second inorganic thin film outside the barrier wall 300; when the first organic film 420, which is also disposed between the first inorganic film 410 and the second inorganic film 430, overflows the barrier wall 300, it can be brought into contact with the organic thin film detecting device, and make the organic thin film detecting device emit an electrical signal indicating overflow.

In this embodiment, the organic thin film detecting device includes a conductive loop disposed around the barrier wall 300, the conductive loop includes a first wire 510 and a second wire 520 surrounding the barrier wall 300, the first wire 510 and the second wire 520 are spaced disposed from one another and are respectively connected to a cathode and an anode of a power source; wherein a distance between the first wire 510 and the second wire 520 is less than or equals to the diameter of the conductive particles. After the organic film overflows the barrier wall, the conductive particles in the organic film are in contact with the first wire 510 and the second wire 520. Since a distance between the first wire 510 and the second wire 520 is less than or equals to the diameter of the transparent conductive particles, the first wire 510 and the second wire 520 are connected by the conductive particles. Thereby, the conductive loop in the organic thin film detecting device is turned on, and an electrical signal indicating overflow is sent out.

Figure 5:
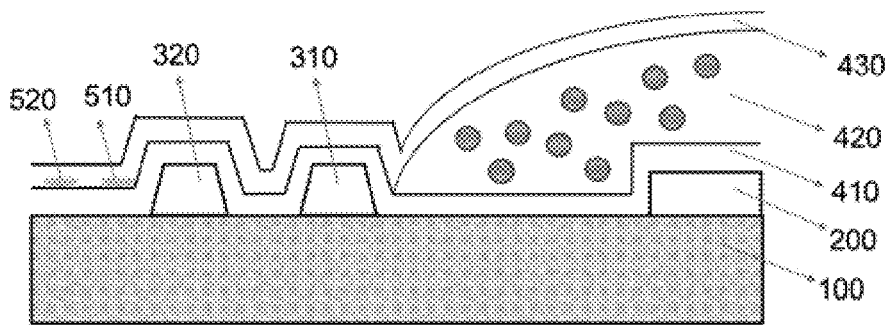
FIG. 5 is a structural diagram of an OLED device according to another embodiment of the present invention.

Preferably, in other embodiments, the number of the barrier walls 300 could be two or more turns. As shown in FIG. 5, the OLED device includes a first barrier wall 310 and a second barrier wall 320. The arrangement of the multilayer barrier walls can better reduce the probability of overflow of the organic film, but at the same time increase the area of the non-display region. It can be set as needed in practice.

The present invention further provides a method of manufacturing an OLED device, comprising the steps of:

providing a substrate 100;

forming a display region 200 and a non-display region 200 surrounding the display region 200 at a center of the substrate 100;

forming an encapsulation structure covering the display region 200 and the non-display region 200; wherein the steps of forming the encapsulation structure includes:

forming at least one ring of barrier wall 300 on the non-display region 200, the barrier wall 300 surrounding the display region 200, a fixed interval being disposed between an edge of the barrier wall 300 close to the display region 200 and an edge of the display region 200;

forming a encapsulating film laminate covering the display region 200 and the non-display region 200, the encapsulating film laminate comprising an organic film, the organic thin edge being defined between the barrier wall 300 and the display region 200;

forming an organic thin film detecting device around the barrier wall 300, after detecting that the organic film overflows the barrier wall 300, the organic thin film detecting device emits an electrical signal indicating overflow.

In this embodiment, the encapsulating film laminate includes at least a first inorganic film 410 covering the barrier wall 300 and the display region 200, a first organic film 420 disposed above the first inorganic film 410, and a second inorganic film 430 disposed above the first organic film 420; wherein the first inorganic film 410 and the second inorganic film 430 cover the display region 200 and the non-display region 200, edges of the first inorganic film and the second inorganic film are located in the non-display region 200 outside the barrier wall 300; the first organic film 420 covers the display region 200, and an edge thereof is located between the barrier wall 300 and the display region 200.

Specifically, the organic film includes conductive particles, and the conductive particles are made of transparent materials having a diameter ranging from 2 to 10 μm; the first wire and the second wire have a width ranging from 1 to 10 μm and a thickness ranging from 0.1 to 1 μm.

The organic thin film detecting device is disposed between the first inorganic thin film and the second inorganic thin film outside the barrier wall 300; when the first organic film 420, which is also disposed between the first inorganic film 410 and the second inorganic film 430, overflows the barrier wall 300, it can be brought into contact with the organic thin film detecting device, and make the organic thin film detecting device emit an electrical signal indicating overflow.

In this embodiment, the organic thin film detecting device includes a conductive loop disposed around the barrier wall 300, the conductive loop includes a first wire 510 and a second wire 520 surrounding the barrier wall 300, the first wire 510 and the second wire 520 are spaced disposed from one another and are respectively connected to a cathode and an anode of a power source; wherein a distance between the first wire 510 and the second wire 520 is less than or equals to the diameter of the conductive particles. After the organic film overflows the barrier wall, the conductive particles in the organic film are in contact with the first wire 510 and the second wire 520. Since a distance between the first wire 510 and the second wire 520 is less than or equals to the diameter of the transparent conductive particles, the first wire 510 and the second wire 520 are connected by the conductive particles. Thereby, the conductive loop in the organic thin film detecting device is turned on, and an electrical signal indicating overflow is sent out.

In the technical solution of the present invention, conductive particles are added to the organic film of the encapsulation structure of the OLED device, and an organic thin film detecting device is disposed outside the barrier wall 300. When the organic film overflows the barrier wall 300 and contacts the organic thin film detecting device, and make the organic thin film detecting device emit an electrical signal indicating overflow, thereby informing users of the overflow condition.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. An organic light emitting diode (OLED) device comprising a substrate, a display region at a center of the substrate, a non-display region surrounding the display region, and an encapsulation structure; wherein
the encapsulation structure comprises:
at least one ring of barrier wall on the non-display region, the barrier wall surrounding the display region, a fixed interval being disposed between an edge of the barrier wall close to the display region and an edge of the display region;
an encapsulating film laminate covering the display region and the non-display region, the encapsulating film laminate comprising an organic film, an edge of the organic film being defined between the barrier wall and the display region;
an organic thin film detecting device surrounding the barrier wall, wherein the organic film comprises conductive particles and a conductive loop disposed around the barrier wall, the conductive loop comprises a first wire and a second wire surrounding the barrier wall, the first wire and the second wire are spaced disposed from one another and are respectively connected to a cathode and an anode of a power source, a distance between the first wire and the second wire is less than or equal to the diameter of the conductive particles, after detecting that the organic film overflows the barrier wall, the first wire and the second wire are connected by the conductive particles, the conductive loop in the organic thin film detecting device is turned on, and the organic thin film detecting device emits an electrical signal indicating overflow; wherein
the encapsulating film laminate comprises at least a first inorganic film covering the barrier wall and the display region, a first organic film disposed above the first inorganic film, and a second inorganic film disposed above the first organic film; wherein
the first inorganic film and the second inorganic film cover the display region and the non-display region, edges of the first inorganic film and the second inorganic film are located in the non-display region outside the barrier wall; the first organic film covers the display region, and an edge thereof is located between the barrier wall and the display region.

2. The OLED device according to claim 1, wherein the conductive particles are made of transparent materials having a diameter ranging from 2 to 10 μm; the first wire and the second wire have a width ranging from 1 to 10 μm and a thickness ranging from 0.1 to 1 μm.

3. The OLED device according to claim 1 wherein the organic thin film detecting device is disposed between the first inorganic thin film and the second inorganic thin film outside the barrier wall; the first organic film disposed between the first inorganic film and the second inorganic film.

4. An organic light emitting diode (OLED) device comprising a substrate, a display region at a center of the substrate, a non-display region surrounding the display region, and a encapsulation structure; wherein
the encapsulation structure comprises:
at least one ring of barrier wall on the non-display region, the barrier wall surrounding the display region, a fixed interval being disposed between an edge of the barrier wall close to the display region and an edge of the display region;
an encapsulating film laminate covering the display region and the non-display region, the encapsulating film laminate comprising an organic film, an edge of the organic film being defined between the barrier wall and the display region;
an organic thin film detecting device surrounding the barrier wall, wherein the organic film comprises conductive particles and a conductive loop disposed around the barrier wall, the conductive loop comprises a first wire and a second wire surrounding the barrier wall, the first wire and the second wire are spaced disposed from one another and are respectively connected to a cathode and an anode of a power source, a distance between the first wire and the second wire is less than or equal to the diameter of the conductive particles, after detecting that the organic film overflows the barrier wall, the first wire and the second wire are connected by the conductive particles, the conductive loop in the organic thin film detecting device is turned on, and the organic thin film detecting device emits an electrical signal indicating overflow.

5. The OLED device according to claim 4, wherein the conductive particles are made of transparent materials having a diameter ranging from 2 to 10 μm; the first wire and the second wire have a width ranging from 1 to 10 μm and a thickness ranging from 0.1 to 1 μm.

6. The OLED device according to claim 4, wherein
the encapsulating film laminate comprises at least a first inorganic film covering the barrier wall and the display region, a first organic film disposed above the first inorganic film, and a second inorganic film disposed above the first organic film; wherein
the first inorganic film and the second inorganic film cover the display region and the non-display region, edges of the first inorganic film and the second inorganic film are located in the non-display region outside the barrier wall; the first organic film covers the display region, and an edge thereof is located between the barrier wall and the display region.

7. The OLED device according to claim 6 wherein the organic thin film detecting device is disposed between the first inorganic thin film and the second inorganic thin film outside the barrier wall; the first organic film disposed between the first inorganic film and the second inorganic film.

8. A method of manufacturing an OLED device, comprising the steps of:
provide a substrate;
forming a display region and a non-display region surrounding the display region at a center of the substrate;
forming an encapsulation structure covering the display region and the non-display region;
wherein the steps of forming the encapsulation structure comprises:
forming at least one ring of barrier wall on the non-display region, the barrier wall surrounding the display region, a fixed interval being disposed between an edge of the barrier wall close to the display region and an edge of the display region;
forming an encapsulating film laminate covering the display region and the non-display region, the encapsulating film laminate comprising an organic film, an edge of the organic film being defined between the barrier wall and the display region;
forming an organic thin film detecting device around the barrier wall, wherein the organic film comprises conductive particles and a conductive loop disposed around the barrier wall, the conductive loop comprises a first wire and a second wire surrounding the barrier wall, the first wire and the second wire are spaced disposed from one another and are respectively connected to a cathode and an anode of a power source, a distance between the first wire and the second wire is less than or equal to the diameter of the conductive particles, after detecting that the organic film overflows the barrier wall, the first wire and the second wire are connected by the conductive particles, the conductive loop in the organic thin film detecting device is turned on, and the organic thin film detecting device emits an electrical signal indicating overflow.

9. The method of manufacturing an OLED device according to claim 8, wherein the conductive particles are made of transparent materials having a diameter ranging from 2 to 10 μm; the first wire and the second wire have a width ranging from 1 to 10 μm and a thickness ranging from 0.1 to 1 μm.

10. The method of manufacturing an OLED device according to claim 8, wherein
the encapsulating film laminate comprises at least a first inorganic film covering the barrier wall and the display region, a first organic film disposed above the first inorganic film, and a second inorganic film disposed above the first organic film; wherein
the first inorganic film and the second inorganic film cover the display region and the non-display region, edges of the first inorganic film and the second inorganic film are located in the non-display region outside the barrier wall; the first organic film covers the display region, and an edge thereof is located between the barrier wall and the display region;
the organic thin film detecting device is disposed between the first inorganic thin film and the second inorganic thin film outside the barrier wall; when the first organic film, which is also disposed between the first inorganic film and the second inorganic film, overflows the barrier wall, it can be brought into contact with the organic thin film detecting device, and make the organic thin film detecting device emit an electrical signal indicating overflow.

* * * * *